(12) United States Patent
Sugawa et al.

(10) Patent No.: US 12,194,543 B2
(45) Date of Patent: *Jan. 14, 2025

(54) COATED TOOL AND CUTTING TOOL INCLUDING THE SAME

(71) Applicant: KYOCERA Corporation, Kyoto (JP)

(72) Inventors: Yuusaku Sugawa, Chikushino (JP); Hirotoshi Ito, Satsumasendai (JP); Kenji Kumai, Satsumasendai (JP); Takanori Sugiyama, Satsumasendai (JP); Tadashi Katsuma, Satsumasendai (JP)

(73) Assignee: KYOCERA Corporation, Kyoto (JP)

( * ) Notice: Subject to any disclaimer, the term of this patent is extended or adjusted under 35 U.S.C. 154(b) by 493 days.

This patent is subject to a terminal disclaimer.

(21) Appl. No.: 17/630,598

(22) PCT Filed: Jul. 28, 2020

(86) PCT No.: PCT/JP2020/028796
§ 371 (c)(1),
(2) Date: Jan. 27, 2022

(87) PCT Pub. No.: WO2021/020368
PCT Pub. Date: Feb. 4, 2021

(65) Prior Publication Data
US 2022/0250161 A1   Aug. 11, 2022

(30) Foreign Application Priority Data

Jul. 29, 2019   (JP) .................................. 2019-138994

(51) Int. Cl.
*B23B 27/14*   (2006.01)
*B23C 5/16*   (2006.01)
(Continued)

(52) U.S. Cl.
CPC ................ *B23B 27/14* (2013.01); *B23C 5/16* (2013.01); *B23B 2224/04* (2013.01);
(Continued)

(58) Field of Classification Search
None
See application file for complete search history.

(56) References Cited

U.S. PATENT DOCUMENTS

2002/0102403 A1* 8/2002 Leverenz ................ C23C 16/36
427/419.1
2007/0227298 A1* 10/2007 Tanibuchi ............... C22C 29/08
75/241
(Continued)

FOREIGN PATENT DOCUMENTS

CN   109982799 A   7/2019
JP   2004-074324 A   3/2004
(Continued)

*Primary Examiner* — Seth Dumbris
(74) *Attorney, Agent, or Firm* — Volpe Koenig

(57) ABSTRACT

A coated tool in the present disclosure includes a base and a coating layer located on a surface of the base. The coating layer includes a TiCN layer, an intermediate layer including Ti, and an $Al_2O_3$ layer in this order from a side of the base. The $Al_2O_3$ layer is located in contact with the intermediate layer at a position further away from the base than the intermediate layer. The intermediate layer includes a plurality of first protrusions protruding toward the $Al_2O_3$ layer. An average area of the plurality of first protrusions is 1700 $nm^2$ or less. A cutting tool in the present disclosure includes a holder which is extended from a first end toward a second end and includes a pocket on a side of the first end, and the coated tool located in the pocket.

10 Claims, 6 Drawing Sheets

(52) U.S. Cl.
CPC ....... *B23B 2224/32* (2013.01); *B23C 2224/04* (2013.01); *B23C 2224/32* (2013.01)

(56) References Cited

U.S. PATENT DOCUMENTS

| | | |
|---|---|---|
| 2013/0149527 A1 | 6/2013 | Cho et al. |
| 2018/0369926 A1 | 12/2018 | Kodama et al. |
| 2019/0039148 A1 | 2/2019 | Kubo et al. |
| 2019/0344356 A1 | 11/2019 | Kodama et al. |
| 2021/0114115 A1 | 4/2021 | Sugawa et al. |

FOREIGN PATENT DOCUMENTS

| | | |
|---|---|---|
| JP | 2009-166216 A | 7/2009 |
| JP | 2010-173025 A | 8/2010 |
| JP | 2010-253594 A | 11/2010 |
| JP | 2012-071396 A | 12/2012 |
| KR | 10-2010-0135641 A | 12/2010 |
| WO | 2017/090765 A1 | 6/2017 |
| WO | 2019/146785 A1 | 8/2019 |

\* cited by examiner

COATED TOOL AND CUTTING TOOL INCLUDING THE SAME

TECHNICAL FIELD

The present disclosure relates to a coated tool including a coating layer on a surface of a base, and a cutting tool including the coated tool.

BACKGROUND

Coated tools, such as cutting tools with a coating layer, have been known in which an $Al_2O_3$ layer is laminated on a surface of a base of cemented carbide, cermet, ceramics or the like by interposing a bonding film therebetween.

With improved efficiency in recent cutting processes, the cutting tools tend to be increasingly used in, for example, a heavy intermittent cutting process during which a cutting edge is subjected to a large impact. The large impact may be exerted on the coating layer under such severe cutting conditions, and the coating layer may be prone to chipping and peeling off. Hence, the coating layer needs improvement in terms of fracture resistance in addition to wear resistance.

In order to solve the above problem, Patent Document 1 discusses that a protrusion whose tip is bent in a hook shape is located on an interface in contact with the $Al_2O_3$ layer.

Patent Document 2 and Patent Document 3 discuss that a composite protrusion including a large number of second protrusions is located on a side surface of a first protrusion extending in a laminate direction of a coating layer on an interface in contact with an $Al_2O_3$ layer.

Of these, the tip of the protrusion discussed in Patent Document 1 and a tip of the composite protrusion discussed in Patent Document 2 have an obtuse angle and such a shape that is poor in film forming properties. In the coating layers discussed in Patent Documents 1 to 3, the first protrusion is large, which leads to the shape having poor film forming properties.

RELATED ART DOCUMENTS

Patent Document

Patent Document 1: Japanese Unexamined Patent Publication No. 2004-74324
Patent Document 2: U.S. Unexamined Patent Publication No. 2013/0149527
Patent Document 3: Japanese Unexamined Patent Publication No. 2009-166216

SUMMARY

Problems to be Solved by the Invention

The invention provides a coated tool excellent in fracture resistance.

Means for Solving the Problems

A coated tool in the present disclosure includes a base and a coating layer located on a surface of the base. The coating layer includes a TiCN layer, an intermediate layer including Ti, and an $Al_2O_3$ layer in this order from a side of the base. The $Al_2O_3$ layer is located in contact with the intermediate layer at a position further away from the base than the intermediate layer. The intermediate layer includes a plurality of first protrusions protruding toward the $Al_2O_3$ layer. An average area of the plurality of first protrusions is 1700 nm² or less. A cutting tool in the present disclosure includes a holder which is extended from a first end toward a second end and includes a pocket on a side of the first end, and the coated tool located in the pocket.

EMBODIMENT

<Coated Tools>

Figure 1:
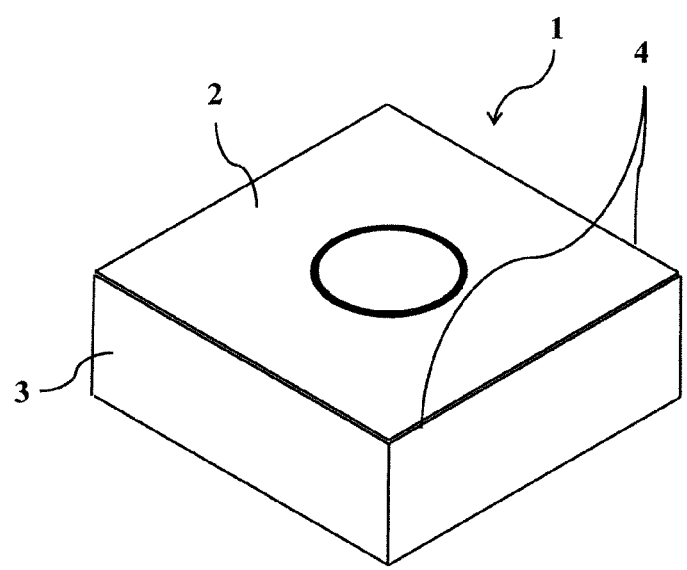
FIG. 1 is a schematic perspective view illustrating an embodiment of coated tools in the present disclosure.

In an embodiment illustrated in FIG. 1, a main surface of a coated tool in the present disclosure has an approximately quadrangular planar shape. However, there is no intention to limit to this shape. The coated tool 1 includes a first surface 2, a second surface 3, and a cutting edge 4 located on at least a part of an intersection of the first surface 2 and the second surface 3. The first surface 2 is a surface called a rake surface, and the second surface 3 is a surface called a flank surface. It can also be said that the cutting edge 4 is located on at least the part of the intersection of the rake surface 2 and the flank surface 3.

Figure 2:
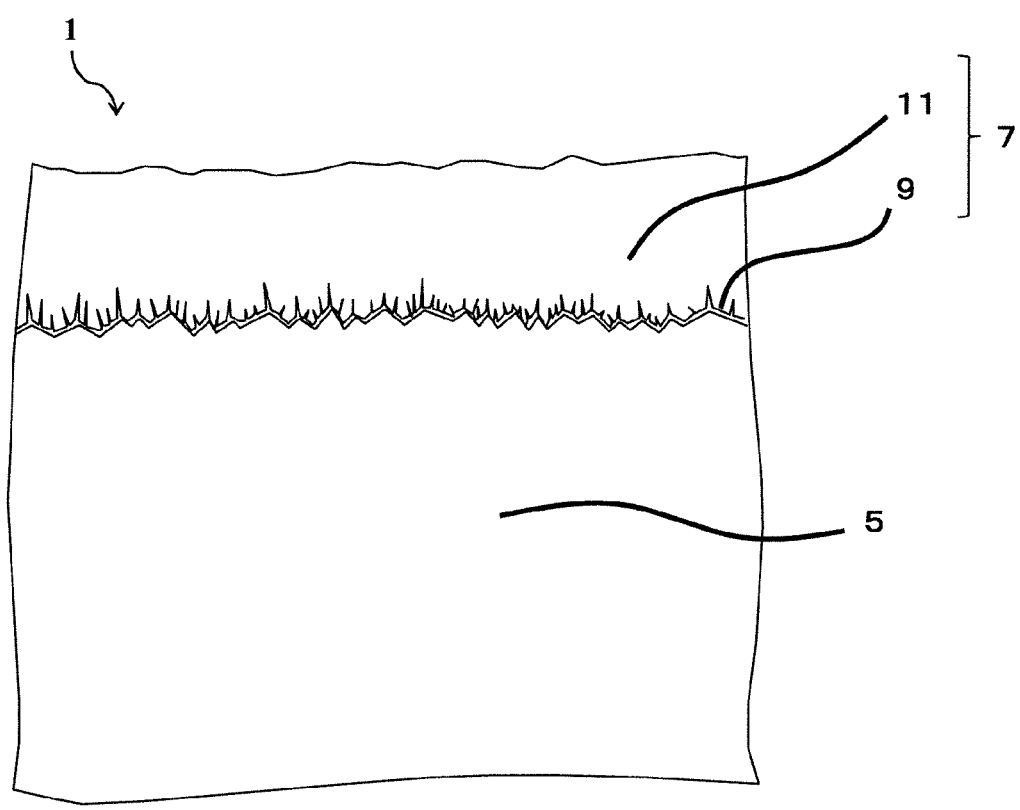
FIG. 2 is a schematic diagram for describing a configuration of a cross section of a coating layer in the coated tool in FIG. 1.

Referring to a schematic diagram of FIG. 2 illustrating a configuration of a cross section of a coating layer 7 in the coated tool 1, the coated tool 1 includes a base 5 and the coating layer 7 located on a surface of the base 5.

Examples of material constituting the base 5 of the coated tool 1 may include hard alloys, ceramics or metals. Examples of the hard alloys may include cemented carbides containing tungsten carbide (WC), and iron group metal such as cobalt (Co) or nickel (Ni). Other hard alloys may be Ti-based cermet containing titanium carbonitride (TiCN), and iron group metal such as cobalt (Co) or nickel (Ni). The ceramics may be $Si_3N_4$, $Al_2O_3$, diamond, or cubic boron nitride (cBN). The metals may be carbon steel, high-speed steel or alloy steel. Of these materials, cemented carbide or cermet is suitable for the base 5 if used as the coated tool 1 in terms of fracture resistance and wear resistance.

The coating layer 7 includes a TiCN layer 8, an intermediate layer 9 and an $Al_2O_3$ layer 11 in this order from a side of the base 5. The $Al_2O_3$ layer 11 is in contact with the intermediate layer 9 at a position away from the base 5 in the intermediate layer 9.

Figure 3:
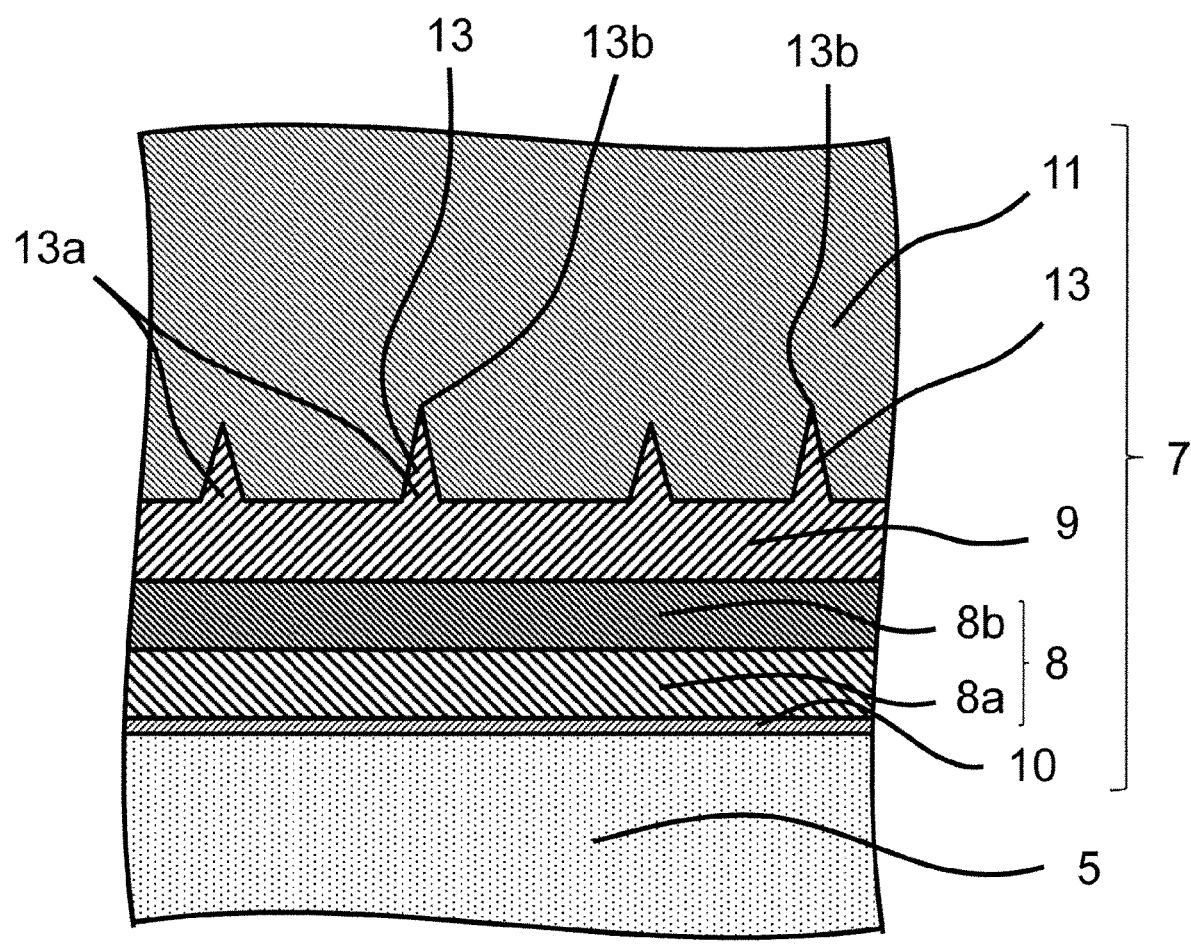
FIG. 3 is an enlarged view of an important part for describing a configuration in the vicinity of an intermediate layer and an $Al_2O_3$ layer in a coated tool of the present disclosure.

In an embodiment of FIG. 3, a first TiCN layer 8a, a second TiCN layer 8b are located in this order from a side of the base 5 in the TiCN layer 8. A TiN layer 10 is located between the TiCN layer 8 and the base 5. The first TiCN layer 8a may be an MT-TiCN layer described later. The second TiCN layer 8b may be an HT-TiCN layer described later. The TiN layer 10 may be located between the TiCN layer 8 and the base 5 in the coated tool 1 of the present disclosure. A TiN layer or the like may be disposed as a surface layer (not illustrated). The surface layer may be a material other than titanium nitride, such as titanium carbonitride, titanium carboxynitride and chromium nitride. The surface layer may be composed of a colored material so as to have the function of easily distinguishing used and unused cutting edge. The surface layer may have a thickness of 0.1-3.0 μm.

The intermediate layer 9 in the coated tool 1 of the present disclosure is a layer including Ti, which may include, for example, TiN, TiC and TiNO. Alternatively, the intermediate layer 9 may include, for example, Ti, C and N. In other words, the intermediate layer 9 may include TiCN crystals. The intermediate layer 9 may include, for example, Ti, C, N and O. In other words, the intermediate layer 9 may include TiCNO crystals. This configuration ensures excellent adhesion properties between the $Al_2O_3$ layer 11 and the intermediate layer 9.

The coated tool 1 of the present disclosure includes a plurality of first protrusions 13 protruding toward the $Al_2O_3$ layer 11 as illustrated in FIG. 3.

Each of the first protrusions 13 includes a foot 13a serving as a start point of protrusion of the first protrusion 13. The first protrusion 13 includes a tip 13b at a position most away from the base 5. In other words, the first protrusion 13 extends from the foot 13a toward the tip 13b. The first protrusion 13 representatively has a triangular shape.

The foot 13a indicates a position near the base 5 in the first protrusion 13. The foot 13a may be rephrased as a bottom side of the triangular shape formed by the first protrusions 13.

The first protrusions 13 in the coated tool 1 of the present disclosure are ones in which the tip 13b has an acute angle and a height of 10 nm or more, and a ratio of an average height of the plurality of first protrusions 13 to an average width of the feet 13a of the plurality of first protrusions 13 is 0.6 or more as illustrated in FIG. 3.

An average area of the plurality of first protrusions 13 is 1700 $nm^2$ or less in the coated tool 1 of the present disclosure. The average area of the plurality of first protrusions 13 may be measured in a cross section vertical to a surface of the base 5. This configuration ensures high adhesion properties between the intermediate layer 9 and the $Al_2O_3$ layer 11. The average area of the plurality of first protrusions 13 may be 1200 $nm^2$ or less. This configuration ensures higher adhesion properties between the intermediate layer 9 and the $Al_2O_3$ layer 11.

The average area of the plurality of first protrusions 13 may be measured, for example, by taking a photograph through a scanning electron microscope or transmission electron microscope at 30,000× magnification. The average area of the plurality of first protrusions 13 may be obtained by measuring approximately 50 to 100 first protrusions 13. The number of photographs thus taken may be suitably determined according to the number of the existing composite protrusions 17. Other configuration requirements in the coated tool 1 of the present disclosure may be measured similarly.

An average number of the second protrusions 15 included in the composite protrusion 17 may be 1.2 or less in the coated tool 1 of the present disclosure. The average number of the second protrusions 15 included in the composite protrusion 17 may be an average value of those of 50 composite protrusions 17. This configuration ensures excellent film forming properties of the $Al_2O_3$ layer 11, and excellent adhesion properties between the intermediate layer 9 and the $Al_2O_3$ layer 11. Because the composite protrusion 17 includes the second protrusion 15, a lower limit value of the average number does not include 1. The average number of the second protrusions 15 included in the composite protrusion 17 may be 1.0 or less.

The average width of the feet 13a of the first protrusions 13 may be 10-50 nm, and the average height of the first protrusions 13 may be 10-60 nm in the coated tool 1 of the present disclosure. This configuration ensures excellent adhesion properties between the intermediate layer 9 and the $Al_2O_3$ layer 11. Alternatively, the average width of the feet 13a may be 25-45 nm. The average height of the first protrusions 13 may be 10-50 nm.

An average angle of the tips 13b of the first protrusions 13 may be 50-90° in the coated tool 1 of the present disclosure. This configuration ensures excellent film forming properties of the $Al_2O_3$ layer 11 and excellent adhesion properties between the intermediate layer 9 and the $Al_2O_3$ layer 11. Alternatively, the average angle of the tips 13b of the first protrusions 13 may be 55° or more. Still alternatively, the average angle of the tips 13b of the first protrusions 13 may be 80° or less. This configuration ensures excellent film forming properties of the $Al_2O_3$ layer 11 and more excellent adhesion properties between the intermediate layer 9 and the $Al_2O_3$ layer 11.

Figure 4:
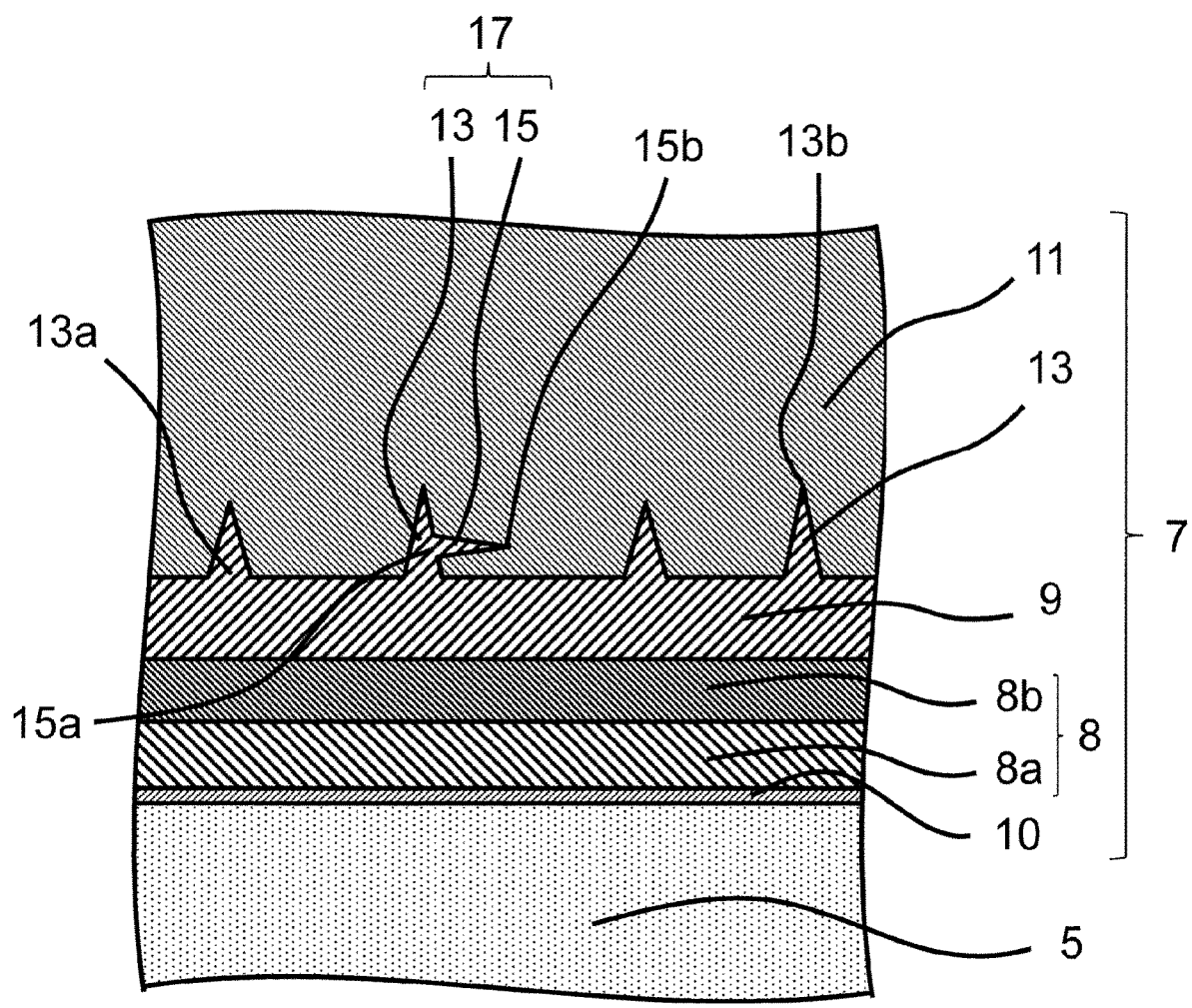
FIG. 4 is an enlarged view of an important part for describing a configuration in the vicinity of an intermediate layer and an $Al_2O_3$ layer in a coated tool of the present disclosure.

At least one of the plurality of first protrusions 13 may be a composite protrusion 17 including the second protrusion 15 protruding in a direction intersecting with a protruding direction of the first protrusions 13 in the coated tool 1 of the present disclosure as illustrated in FIG. 4. Alternatively, all the first protrusions 13 may be the composite protrusions 17 in the coated tool 1 of the present disclosure. Hereinafter, the first protrusion 13 including the second protrusion 15 is referred to as the composite protrusion 17.

If the coated tool 1 of the present disclosure includes the composite protrusion 17, the average area of the plurality of first protrusions 13 is obtained by measuring only the first protrusions 13 while excluding the area of the second protrusions 15.

The composite protrusion 17 in the coated tool 1 of the present application are ones in which a foot of the second protrusion 15 is located away from a foot of the first protrusion 13 as illustrated in FIG. 4. In other words, one in which a plurality of first protrusions 13 are overlapped with one another is not regarded as the composite protrusion 17.

The second protrusions 15 in the coated tool 1 of the present disclosure are ones in which a height from a midportion of the foot 15a of the second protrusion 15 serving as a start point of the protrusion of the second protrusion 15 to the tip 15b of the second protrusion 15 is 10 nm or more. In other words, fine irregularities located on a side surface of the first protrusion 13 is not regarded as the second protrusion 15 in the coated tool 1 of the present disclosure.

A percentage of the composite protrusions 17 in the plurality of first protrusions 13 may be 30% or less in the coated tool 1 of the present application. For example, there are four first protrusions in FIG. 4, and one of them is the composite protrusion 17. In this case, a percentage of the composite protrusions 17 in the plurality of first protrusions 13 is 25%. This configuration ensures excellent adhesion properties between the intermediate layer 9 and the $Al_2O_3$ layer 11.

The percentage of the composite protrusions 17 in the plurality of first protrusions 13 may be 5% or more. Alternatively, the percentage of the composite protrusions 17 in the plurality of first protrusions 13 may be 20% or less.

The ratio of the average height of the plurality of first protrusions 13 to the average width of the feet 13a of the plurality of first protrusions 13 may be 1.2 or less in the coated tool 1 of the present disclosure. This configuration ensures excellent adhesion properties between the intermediate layer 9 and the $Al_2O_3$ layer 11.

The ratio of the average height of the plurality of first protrusions 13 to the average width of the feet 13a of the plurality of first protrusions 13 may be 1.0 or less.

A ratio of an average height of the second protrusions 15 to an average width of the feet 15a of the second protrusions 15 may be larger than a ratio of an average height of a plurality of first protrusions 13 to the average width of the feet 13a of the plurality of first protrusions 13 in the coated tool 1 of the present disclosure. As used herein, the ratio of the average height of the second protrusions 15 to the average width of the feet 15a of the second protrusions 15 is a value obtained by dividing an average height from the midportions of the feet 15a of the second protrusions 15 to the tips 15b of the second protrusions 15 by the average width of the feet 15a of the second protrusions 15. This configuration ensures more excellent adhesion properties between the intermediate layer 9 and the $Al_2O_3$ layer 11.

Figure 5:
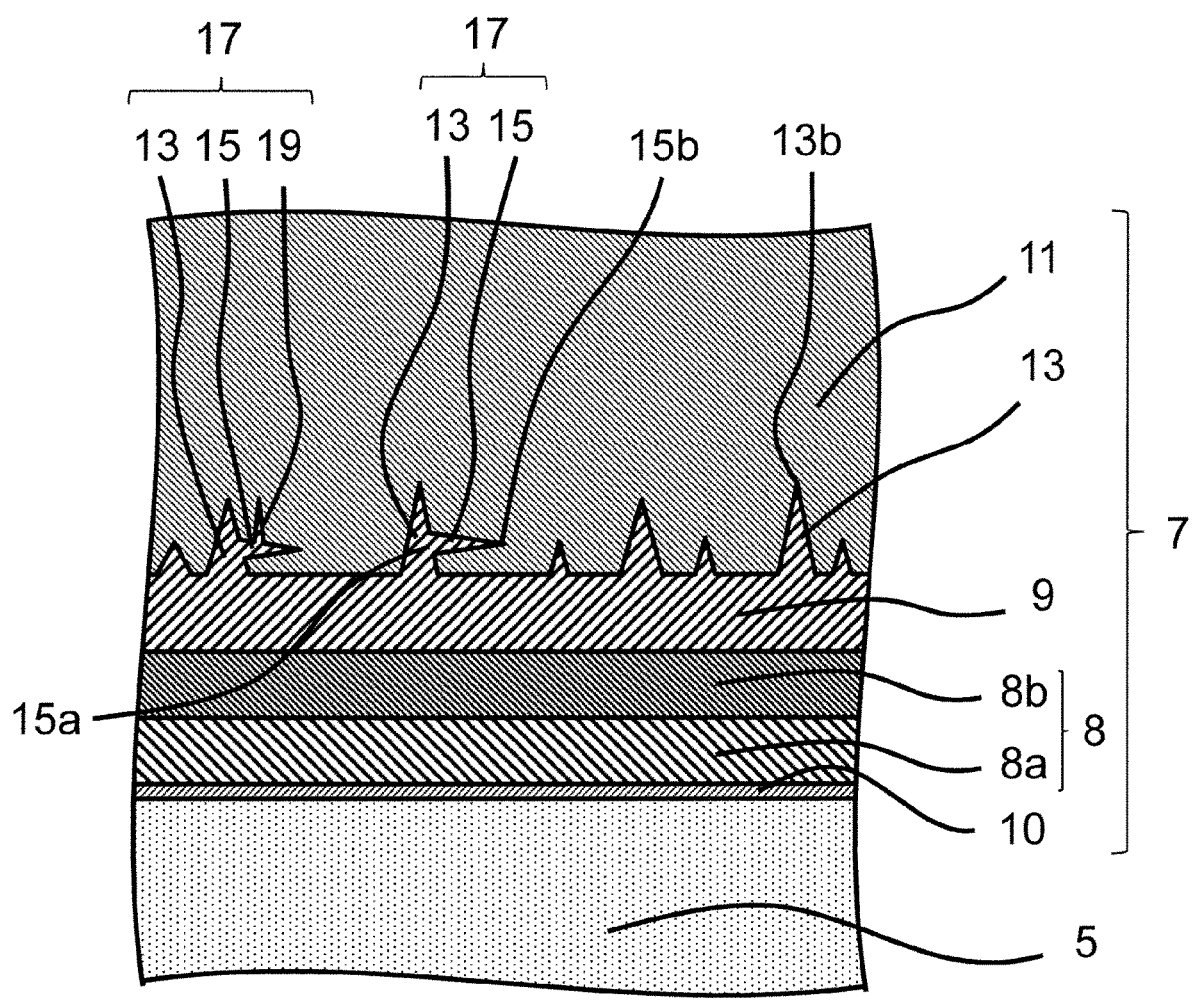
FIG. 5 is an enlarged view of an important part for describing a configuration in the vicinity of an intermediate layer and an $Al_2O_3$ layer in a coated tool of the present disclosure.

The composite protrusion 17 may include a third protrusion 19 protruding in a direction intersecting with the protruding direction of the second protrusion 15 as illustrated in FIG. 5. This configuration ensures more excellent adhesion properties between the intermediate layer 9 and the $Al_2O_3$ layer 11. A height of the third protrusion 19 is 10 nm or more. In other words, fine irregularities located on aside surface of the second protrusions 15 is not regarded as the third protrusion 19 in the coated tool 1 of the present disclosure. The fine irregularities does not substantially contribute to the adhesion properties between the intermediate layer 9 and the $Al_2O_3$ layer 11.

All the first protrusion 13, the second protrusion 15 and the third protrusion 19 may include Ti, C and N, and may have the same composition in the coated tool 1 of the present disclosure. All the first protrusion 13, the second protrusion 15 and the third protrusion 19 may include Ti, C, N and O, and may have the same composition. If the first protrusion 13, the second protrusion 15 and the third protrusion 19 have the same composition, cracking and breakage are less likely to occur between the first protrusion 13, the second protrusion 15 and the third protrusion 19. This leads to higher adhesion properties between the intermediate layer 9 and the $Al_2O_3$ layer 11 than having different compositions.

The phrase that the first protrusion 13, the second protrusion 15 and the third protrusion 19 have the same composition denotes that a difference in structural component among them is 5% or less.

A compositional difference among them may be 3% or less, or alternatively may be 1% or less.

The first protrusion 13, the second protrusion 15 and the third protrusion 19 are obtainable by using the same gas when depositing the first protrusion 13, the second protrusion 15 and the third protrusion 19.

The first protrusion 13 and the second protrusion 15 may be different in composition, and the second protrusion 15 and the third protrusion 19 may be different in composition.

The first protrusion 13, the second protrusion 15 and the third protrusion 19, which are different in composition, may be deposited using gases different in composition.

The first protrusion 13 may be inclined relative to the first surface 2 of the base 5, instead of being deposited vertical to the first surface 2 of the base 5.

If the intermediate layer 9 has a thickness of 10-35 nm, hardness of the intermediate layer 9 does not deteriorate, and the $Al_2O_3$ layer 11 has an α-type crystal structure. As used herein, the thickness of the intermediate layer 9 is one which is obtained by excluding the first protrusion 13, the second protrusion 15 and the third protrusion 19.

The intermediate layer 9 may include the following amounts: 30-70 atom % of titanium, 1-70 atom % of carbon, 1-35 atom % of nitrogen and 3-20 atom % of oxygen. The intermediate layer 9 may further include 10 atom % or less of aluminum, or may include 1-10 atom % of components, such as chlorine or chromium. Alternatively, the intermediate layer 9 may include other minor components.

The first protrusion 13, the second protrusion 15 and the third protrusion 19 may have the same composition and may fall within the composition range described above in the coated tool 1 of the present disclosure.

<Manufacturing Method>

An intermediate layer including first protrusions is formable, for example, by deposition with chemical vapor deposition (CVD) method on a surface of a base under the following conditions.

If depositing the TiN layer on a surface of the base, deposition may be carried out at a deposition temperature of 800-940° C. and a gas pressure of 8-50 kPa by putting the base in a chamber of a deposition apparatus, and by using a reaction gas whose composition is 0.5-10 vol % of titanium tetrachloride ($TiCl_4$) gas, 10-60 vol % of nitrogen ($N_2$) gas, and the rest, namely, hydrogen ($H_2$) gas.

Subsequently, a TiCN layer is deposited on the TiN layer. A first TiCN layer and a second TiCN layer may be located on the TiN layer. The first TiCN layer may be a so-called MT (moderate temperature)-TiCN layer. The MT-TiCN layer is formable, for example, by carrying out deposition using a raw material including titanium tetrachloride ($TiCl_4$) gas, nitrogen ($N_2$) gas and acetonitrile ($CH_3CN$) gas at a relatively low deposition temperature, specifically 780-880° C. If the first TiCN layer has a thickness of 2-15 μm, the first TiCN layer has enhanced wear resistance and fracture resistance. Titanium carbonitride crystals included in the first TiCN layer may be columnar crystals that are narrow and long in a thickness direction of the coating layer.

The second TiCN layer may be a so-called HT (high temperature)-TiCN layer. For example, the HT-TiCN layer may be deposited by using, as a raw material gas, titanium tetrachloride ($TiCl_4$) gas, nitrogen ($N_2$) gas and methane ($CH_4$) gas, without using acetonitrile ($CH_3CN$) gas, in a deposition temperature range of 900-1050° C. The deposition may be carried out at a higher temperature than the first TiCN layer. The second TiCN layer may have a thickness of 10-900 nm.

An interface layer (not illustrated) including the following amounts of 30-70 atom % of titanium, 15-35 atom % of carbon, 15-35 atom % of nitrogen and 2-10 atom % of oxygen may be located between the first TiCN layer and the second TiCN layer. The interface layer may have a thickness of 5-50 nm.

Embodiments of deposition conditions of the first TiCN layer are described in detail below. Deposition may be carried out at a deposition temperature of 780-880° C. and a gas pressure of 5-25 kPa by using a reaction gas whose composition is 0.5-10 vol % of titanium tetrachloride ($TiCl_4$) gas, 5-60 vol % of nitrogen ($N_2$) gas, 0.1-3.0 vol % of acetonitrile ($CH_3CN$) gas and the rest, namely, hydrogen ($H_2$) gas. By increasing a content ratio of acetonitrile ($CH_3CN$) gas at a late stage than an early stage, an average crystal width of titanium carbonitride columnar crystals constituting the first TiCN layer can be made larger on a side of the surface than on a side of the base.

Deposition conditions of the second TiCN layer are described below. Deposition may be carried out at a deposition temperature of 900-990° C. and a gas pressure of 5-40 kPa by using a reaction gas whose composition is 1-4 vol % of titanium tetrachloride ($TiCl_4$) gas, 5-20 vol % of nitrogen ($N_2$) gas, 0.1-10 vol % of methane ($CH_4$) gas, and the rest, namely, hydrogen ($H_2$) gas.

Subsequently, an intermediate layer is deposited on the TiCN layer. For example, deposition conditions of the intermediate layer may be a deposition temperature of 900-990° C. and a gas pressure of 15-40 kPa. Deposition may be carried out using a reaction gas whose composition is 3-15 vol % of titanium tetrachloride ($TiCl_4$) gas, 3-10 vol % of methane ($CH_4$) gas, 3-50 vol % of nitrogen ($N_2$) gas, 0.2-1.0 vol % of carbon monoxide (CO) gas, and the rest, namely, hydrogen ($H_2$) gas. This process is conveniently called a first term process in a deposition process of the intermediate layer. Deposition time in the first term process may be 20-40 minutes. If the nitrogen ($N_2$) gas of the reaction gas composition is set to 30-50 vol %, an average width of the feet of the first protrusions tends to become larger, and an average height of the first protrusions tends to become smaller. In other words, it is easy to obtain the first protrusions that are thick and short and are less prone to fracture under the above conditions. The deposition time of the first term process is preferably 20-40 minutes. Under the above deposition conditions, it is easy to form the first protrusions in which an average distance between the feet is 70-120 nm.

Second protrusions are formable by lowering the deposition temperature to a range of 900-940° C. without changing a combination of raw material gases in a latter term in the deposition of the intermediate layer. Total deposition time of the former term process and the latter term process may be 30-90 minutes.

The number of the second protrusions tends to increase, and width and height tend to increase by extending the deposition time in the latter term in the deposition of the intermediate layer, namely, the process of forming the second protrusions. Additionally, it is easy to form the second protrusions whose extending direction is directed toward the base. Third protrusions extending from the second protrusions are formed by further extending the deposition time.

After depositing the intermediate layer, an $Al_2O_3$ layer may be deposited at a deposition temperature of 900-990° C. and a gas pressure of 5-20 kPa by using a reaction gas whose composition is 3.5-15 vol % of aluminum trichloride ($AlCl_3$) gas, 0.5-2.5 vol % of hydrogen chloride (HCl) gas, 0.5-5.0 vol % of carbon dioxide ($CO_2$) gas, 0-1.0 vol % of hydrogen sulfide ($H_2S$) gas, and the rest, namely, hydrogen ($H_2$) gas. The $Al_2O_3$ layer may be composed of α-alumina.

Thereafter, if needed, at least a cutting edge part of a surface of the coating layer thus deposited is subjected to a polishing process. The cutting edge part becomes smooth by the polishing process, and a workpiece is less susceptible to welding, thereby achieving a tool that is more excellent in fracture resistance.

While the coated tools of the present disclosure have been described, the present disclosure is not limited to the above embodiments, and various improvements and changes may be made without departing from the spirit and scope of the present disclosure.

<Cutting Tools>

A cutting tool of the present disclosure is described below with reference to the drawings.

Figure 6:
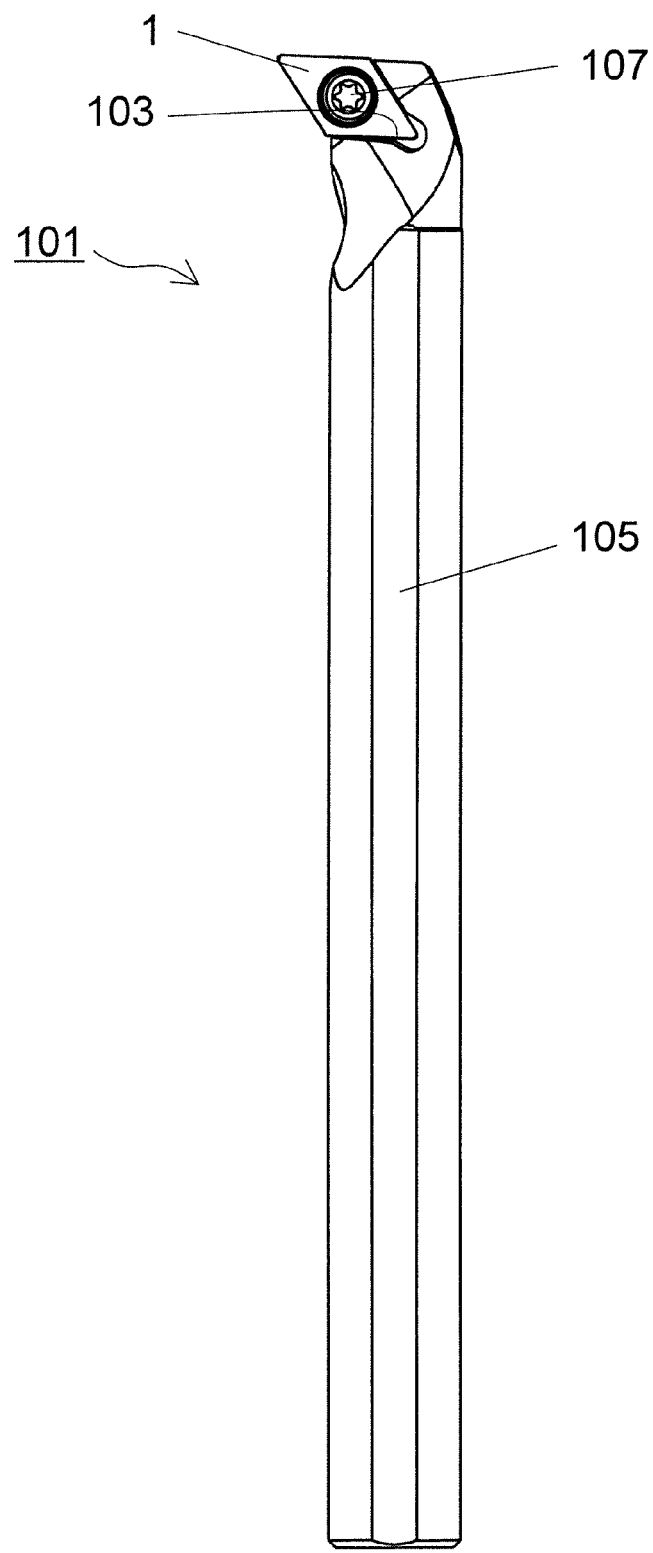
FIG. 6 is a plan view illustrating an embodiment of cutting tools in the present disclosure.

As illustrated in FIG. 6, the cutting tool 101 of the present disclosure is, for example, a bar-shaped body extended from a first end (an upper end in FIG. 6) toward a second end (a lower end in FIG. 6). As illustrated in FIG. 6, the cutting tool 101 includes a holder 105 with a pocket 103 located on a side of the first end (a tip), and the coated tool 1 located in the pocket 103. The cutting tool 101 includes the coated tool 1 and is therefore capable of carrying out a stable cutting process for a long period of time.

The pocket 103 is a part that permits attachment of the coated tool 1. The pocket 103 includes a seating surface parallel to a lower surface of the holder 105, and a constraining lateral surface inclined relative to the seating surface. The pocket 103 opens into a side of the first end of the holder 105.

The coated tool 1 is located in the pocket 103. A lower surface of the coated tool 1 may be in a direct contact with the pocket 103. Alternatively, a sheet (not illustrated) may be held between the coated tool 1 and the pocket 103.

The coated tool 1 is attached to the holder 105 so that at least a part of a ridgeline where the first surface 2 intersects with the second surface 3, which is usable as the cutting edge 4, is protruded outward from the holder 105. The coated tool 1 is attached to the holder 105 by a screw 107 in the present embodiment. Specifically, the coated tool 1 is attached to the holder 105 in such a manner that screw parts are engaged with each other by inserting the screw 107 into a through hole 17 of the coated tool 1, and by inserting a front end of the screw 107 into a screw hole (not illustrated) formed in the pocket 103.

For example, steel and cast iron are usable as a material of the holder 105. Of these materials, highly tough steel may be used.

The present embodiment has illustrated and described the cutting tool 101 for use in a so-called turning process. Examples of the turning process include inner diameter processing, outer diameter processing and grooving process. The cutting tool 101 is not limited to one which is used for the turning process. For example, the coated tools 1 of the above embodiments may be used for cutting tools used in a milling process.

EXAMPLES

Firstly, 6 mass % of metal cobalt powder having a mean particle diameter of 1.2 μm, 0.5 mass % of titanium carbide powder having a mean particle diameter of 2.0 μm, 5 mass % of niobium carbide powder having a mean particle diameter of 2.0 μm, and the rest, namely, tungsten carbide powder having a mean particle diameter of 1.5 μm were added and mixed together in their respective proportions. A mixture thus obtained was molded into a tool shape (CNMG120408) by press molding, followed by debinding and sintering in a non-oxidizing atmosphere, such as an argon atmosphere and nitrogen atmosphere, at 1450-1600° C. for one hour, thereby manufacturing a base composed of cemented carbide. Thereafter, the manufactured base was subjected to brushing, and a part of the base, serving as a cutting edge, was subjected to round honing.

Subsequently, a coating layer was deposited on the base of the cemented carbide by chemical vapor deposition (CVD) method. A TiN layer was deposited on a surface of the base of the cemented carbide, and a first TiCN layer, a second TiC layer, an intermediate layer and an $Al_2O_3$ layer were sequentially deposited on the TiN layer in an embodiment of Table 1. Deposition conditions of the intermediate layers of individual samples were presented in Table 1. The intermediate layer was deposited using $TiCl_4$ gas, $N_2$ gas, CO gas, and $H_2$ gas. Columns of raw material gases in Table 1 indicate vol % of these individual gases. Depositions were carried out in the order of a first term and a latter term under deposition conditions indicated in columns of the first term and the latter term in Table 1. In Samples where the deposition conditions are described only for the first term and the column of the latter term is blank, the deposition was carried out under the deposition conditions for the first term while keeping the deposition conditions unchanged.

A deposition temperature of the $Al_2O_3$ layer was 950° C., and a gas pressure was 7.5 kPa. A reaction gas composition was 3.7 vol % of aluminum trichloride ($AlCl_3$) gas, 0.7 vol % of hydrogen chloride (HCl) gas, 4.3 vol % of carbon dioxide ($CO_2$) gas, 0.3 vol % of hydrogen sulfide ($H_2S$) gas, and the rest, namely, hydrogen ($H_2$) gas. Deposition time of the $Al_2O_3$ layer was 380 minutes.

Deposition conditions of the TiN layer are described below. A deposition temperature of the TiN layer was 850° C., and a gas pressure was 16 kPa. A reaction gas composition was 1.0 vol % of titanium tetrachloride ($TiCl_4$) gas, 38 vol % of nitrogen ($N_2$) gas, and the rest, namely, hydrogen ($H_2$) gas. Deposition time was 180 minutes.

Deposition conditions of the first TiCN layer are described below. A deposition temperature was 850° C., and a gas pressure was 9.0 kPa. A reaction gas composition was 4.0 vol % of titanium tetrachloride ($TiCl_4$) gas, 23 vol % of nitrogen ($N_2$) gas, 0.4 vol % of acetonitrile ($CH_3CN$) gas, and the rest, namely, hydrogen ($H_2$) gas. Deposition time was 400 minutes.

Deposition conditions of the second TiCN layer are described below. A deposition temperature was 950° C., and a gas pressure was kPa. A reaction gas composition was 4 vol % of titanium tetrachloride ($TiCl_4$) gas, 20 vol % of nitrogen ($N_2$) gas, 8 vol % of methane ($CH_4$) gas, and the rest, namely, hydrogen ($H_2$) gas. Deposition time was 80 minutes.

An SEM observation of a cross section including the coating layer of the samples in Table 1 was carried out to measure a percentage of the composite protrusions in the plurality of first protrusions. Additionally, shapes of the first protrusions and the composite protrusions were observed. The results thereof are presented in Table 1.

Fracture resistance was evaluated by conducting an intermittent cutting test using the obtained samples under the following conditions. Test results are presented in Table 1. The number of impacts (ratio) presented in Table 1 is the ratio of the number of the impacts on the individual samples to the number of impacts on Sample No. 1. Samples have more excellent fracture resistance with increasing the number of impacts (ratio).

<Intermittent Cutting Conditions>
  Workpiece: chromium molybdenum steel, a steel material with four grooves (SCM440)
  Tool Shape: CNMG120408
  Cutting Speed: 300 m/min
  Feed Rate: 0.3 mm/rev
  Depth of Cut: 1.5 mm
  Others: Using water-soluble cutting fluid
  Evaluation Item: Measuring the number of impacts until occurrence of peeling off of the $Al_2O_3$ layer

TABLE 1

| Sample No. | | Deposition conditions of intermediate layers | | | | | | | Average area of first protrusions ($nm^2$) | Average width of first protrusions (nm) | Average height of first protrusions (nm) |
| | | $TiCl_4$ | $N_2$ | $CH_4$ | CO | $H_2$ | Temperature (° C.) | Pressure (kPa) | Time (min) | | | |
| --- | --- | --- | --- | --- | --- | --- | --- | --- | --- | --- | --- | --- |
| 1 | First term | 4.0 | 20 | 8 | 1.40 | Rest | 970 | 10 | 30 | 1950 | 30 | 130 |
|   | Latter term | 4.0 | 20 | 8 | 1.40 | Rest | 940 | 10 | 10 | | | |
| 2 | First term | 4.0 | 40 | 8 | 1.40 | Rest | 970 | 10 | 30 | 3600 | 60 | 120 |
|   | Latter term | 4.0 | 40 | 8 | 1.40 | Rest | 940 | 10 | 10 | | | |
| 3 | First term | 4.0 | 40 | 8 | 0.45 | Rest | 970 | 20 | 30 | 1625 | 50 | 65 |
|   | Latter term | 4.0 | 40 | 8 | 0.40 | Rest | 940 | 20 | 10 | | | |
| 4 | First term | 4.0 | 40 | 8 | 0.45 | Rest | 970 | 20 | 30 | 1013 | 45 | 45 |
| 5 | First term | 4.0 | 40 | 8 | 0.45 | Rest | 970 | 20 | 30 | 1450 | 50 | 58 |
|   | Latter term | 4.0 | 40 | 8 | 0.30 | Rest | 940 | 20 | 10 | | | |
| 6 | First term | 4.0 | 40 | 8 | 0.45 | Rest | 970 | 20 | 30 | 1300 | 50 | 52 |
|   | Latter term | 4.0 | 40 | 8 | 0.20 | Rest | 940 | 20 | 10 | | | |
| 7 | First term | 4.0 | 40 | 8 | 0.40 | Rest | 970 | 20 | 30 | 1283 | 45 | 57 |
|   | Latter term | 4.0 | 40 | 8 | 0.30 | Rest | 940 | 20 | 10 | | | |
| 8 | First term | 4.0 | 40 | 8 | 0.40 | Rest | 970 | 20 | 30 | 1125 | 45 | 50 |
|   | Latter term | 4.0 | 40 | 8 | 0.20 | Rest | 940 | 20 | 10 | | | |
| 9 | First term | 4.0 | 40 | 8 | 0.20 | Rest | 970 | 20 | 30 | 700 | 40 | 35 |
|   | Latter term | 4.0 | 40 | 8 | 0.20 | Rest | 940 | 20 | 10 | | | |
| 10 | First term | 4.0 | 20 | 8 | 0.05 | Rest | 970 | 20 | 30 | 875 | 35 | 50 |

| Sample No. | Height/width of first protrusions | Angle of tip of first protrusions (°) | Ratio of composite protrusions (%) | Average number of second protrusions | Height/width of second protrusions | Presence or absence of third protrusions | Number of impacts (ratio) |
| --- | --- | --- | --- | --- | --- | --- | --- |
| 1 | 4.33 | 13 | 35 | 1.5 | 4.10 | Present | 1 |
| 2 | 2.00 | 28 | 35 | 1.5 | 2.00 | Present | 1.1 |
| 3 | 1.30 | 42 | 25 | 1.4 | 1.50 | Present | 1.3 |
| 4 | 1.00 | 53 | — | — | — | Absent | 1.1 |
| 5 | 1.16 | 47 | 22 | 1.3 | 1.25 | Present | 1.4 |

TABLE 1-continued

| | | | | | | | |
|---|---|---|---|---|---|---|---|
| 6 | 1.04 | 51 | 18 | 1.2 | 1.10 | Present | 1.5 |
| 7 | 1.27 | 43 | 22 | 1.3 | 1.30 | Present | 1.4 |
| 8 | 1.11 | 48 | 18 | 1.2 | 1.15 | Present | 1.6 |
| 9 | 0.88 | 59 | 15 | 1.1 | 0.90 | Present | 1.8 |
| 10 | 1.43 | 39 | — | — | — | Absent | 0.8 |

The coated tools of Samples Nos. 3 and 5 to 9 in Table 1, which were examples of the present disclosure and in which the average area of a plurality of first protrusions is 1700 nm$^2$ or less, were excellent in fracture resistance. Samples Nos. 1 and 2, in which the percentage of the composite protrusions in the plurality of first protrusions exceeded 30%, had lower fracture resistance than Samples Nos. 3 and 5 to 9. Samples Nos. 4 and 10 including no composite protrusion also had lower fracture resistance than Samples Nos. 3 and 5 to 9.

DESCRIPTION OF THE REFERENCE NUMERAL 1 coated tool
2 first surface, rake surface
3 second surface, flank surface
4 cutting edge
5 base
7 coating layer
8a first TiCN layer
8b second TiCN layer
9 intermediate layer
10 TiN layer
11 Al$_2$O$_3$ layer
12 first protrusion
13a foot of first protrusion
13b tip of first protrusion
15 second protrusion
15a foot of second protrusion
15b tip of second protrusion
17 composite protrusion
19 third protrusion
101 cutting tool
103 pocket
105 holder
107 screw

The invention claimed is:
1. A coated tool, comprising:
a base; and
a coating layer located on a surface of the base,
the coating layer comprising a TiCN layer, an intermediate layer comprising Ti, and an Al$_2$O$_3$ layer in this order from a side of the base,
wherein
the Al$_2$O$_3$ layer is located in contact with the intermediate layer at a position further away from the base than the intermediate layer,
the intermediate layer comprises a plurality of first protrusions protruding toward the Al$_2$O$_3$ layer,
an average area of the plurality of first protrusions is 1700 nm$^2$ or less, and
a ratio of an average height of the plurality of first protrusions to an average width of feet of the plurality of first protrusions is 1.2 or less.

2. The coated tool according to claim 1, wherein an average width of feet of the first protrusions is 10-50 nm, and an average height of the first protrusions is 10-60 nm.

3. The coated tool according to claim 1, wherein an average angle of tips of the first protrusions is 50-90°.

4. The coated tool according to claim 1, wherein at least one of the plurality of first protrusions is a composite protrusion comprising a second protrusion protruding in a direction intersecting with a protrusion direction of the first protrusions.

5. The coated tool according to claim 4, wherein an average number of the second protrusions comprised in the composite protrusion is 1.2 or less.

6. The coated tool according to claim 4, wherein a ratio of an average height of the second protrusions to an average width of feet of the second protrusions is larger than a ratio of an average height of the plurality of first protrusions to an average width of feet of the plurality of first protrusions.

7. The coated tool according to claim 4, wherein the composite protrusion comprises a third protrusion protruding in a direction intersecting with a protruding direction of the second protrusion on a side surface of the second protrusion.

8. The coated tool according to claim 1, wherein the intermediate layer comprises C and N.

9. The coated tool according to claim 8, wherein the intermediate layer further comprises O.

10. A cutting tool, comprising:
a holder extending from a first end toward a second end and comprising a pocket on a side of the first end; and
the coated tool according to claim 1 which is located in the pocket.

* * * * *